(12) United States Patent
Ryou et al.

(10) Patent No.: US 11,780,057 B2
(45) Date of Patent: Oct. 10, 2023

(54) POLISHING PAD AND METHOD FOR PRODUCING SAME

(71) Applicant: SK enpulse Co., Ltd., Gyeonggi-do (KR)

(72) Inventors: Joonsung Ryou, Gyeonggi-do (KR); Tae Kyoung Kwon, Ulsan (KR); Jang Won Seo, Busan (KR); Sunghoon Yun, Gyeonggi-do (KR)

(73) Assignee: SK ENPULSE CO., LTD., Gyeonggi-do (KR)

( * ) Notice: Subject to any disclaimer, the term of this patent is extended or adjusted under 35 U.S.C. 154(b) by 931 days.

(21) Appl. No.: 16/479,824

(22) PCT Filed: Jan. 18, 2018

(86) PCT No.: PCT/KR2018/000850
§ 371 (c)(1),
(2) Date: Jul. 22, 2019

(87) PCT Pub. No.: WO2018/135878
PCT Pub. Date: Jul. 26, 2018

(65) Prior Publication Data
US 2021/0354267 A1    Nov. 18, 2021

(30) Foreign Application Priority Data
Jan. 23, 2017 (KR) .................. 10-2017-0010401

(51) Int. Cl.
*B24D 18/00* (2006.01)
*B24B 37/20* (2012.01)
*B24B 37/22* (2012.01)

(52) U.S. Cl.
CPC ........ *B24D 18/0045* (2013.01); *B24B 37/205* (2013.01); *B24B 37/22* (2013.01)

(58) Field of Classification Search
CPC ....... B24B 37/04; B24B 37/20; B24B 37/205; B24B 37/22; B24B 37/26; B24B 57/02;
(Continued)

(56) References Cited

U.S. PATENT DOCUMENTS 6,171,181 B1 * 1/2001 Roberts ................ B24B 37/205
451/526
6,358,130 B1 * 3/2002 Freeman ................ B24B 49/12
451/529
(Continued)

FOREIGN PATENT DOCUMENTS

JP    2003-048151    2/2003
KR   10-2005-0050582    5/2005
(Continued)

*Primary Examiner* — Katina N. Henson
(74) *Attorney, Agent, or Firm* — IP & T GROUP LLP

(57) ABSTRACT

Disclosed is a method for producing a polishing pad, the method comprising the steps of: providing a polishing layer; forming a first through-hole penetrating the polishing layer; providing a support layer facing the polishing layer; interposing an adhesive layer between the polishing layer, which has the first through-hole, and support layer, and adhering the polishing layer and support layer to each other by means of the adhesive layer; forming, with the first through-hole as a reference point, a third through-hole penetrating the adhesive layer on a set area thereof, and a second through-hole penetrating the support layer on a set area thereof; and inserting a window inside the first through-hole.

6 Claims, 2 Drawing Sheets

(58) Field of Classification Search
CPC ... B24D 18/00; B24D 18/0045; H01L 21/306; H01L 21/30625
See application file for complete search history.

(56) References Cited

U.S. PATENT DOCUMENTS

| | | | |
|---|---|---|---|
| 6,722,249 B2* | 4/2004 | David | B24B 49/12 451/527 |
| 2003/0171081 A1* | 9/2003 | Komukai | B24B 53/017 451/6 |
| 2005/0070216 A1* | 3/2005 | Roberts | B24B 37/22 451/433 |
| 2005/0191945 A1* | 9/2005 | Petroski | B24B 37/205 451/526 |

FOREIGN PATENT DOCUMENTS

| | | |
|---|---|---|
| KR | 10-2009-0130147 | 12/2009 |
| KR | 10-2013-0088744 | 8/2013 |
| KR | 10-2014-0110786 | 9/2014 |
| KR | 10-1633766 | 6/2016 |

* cited by examiner

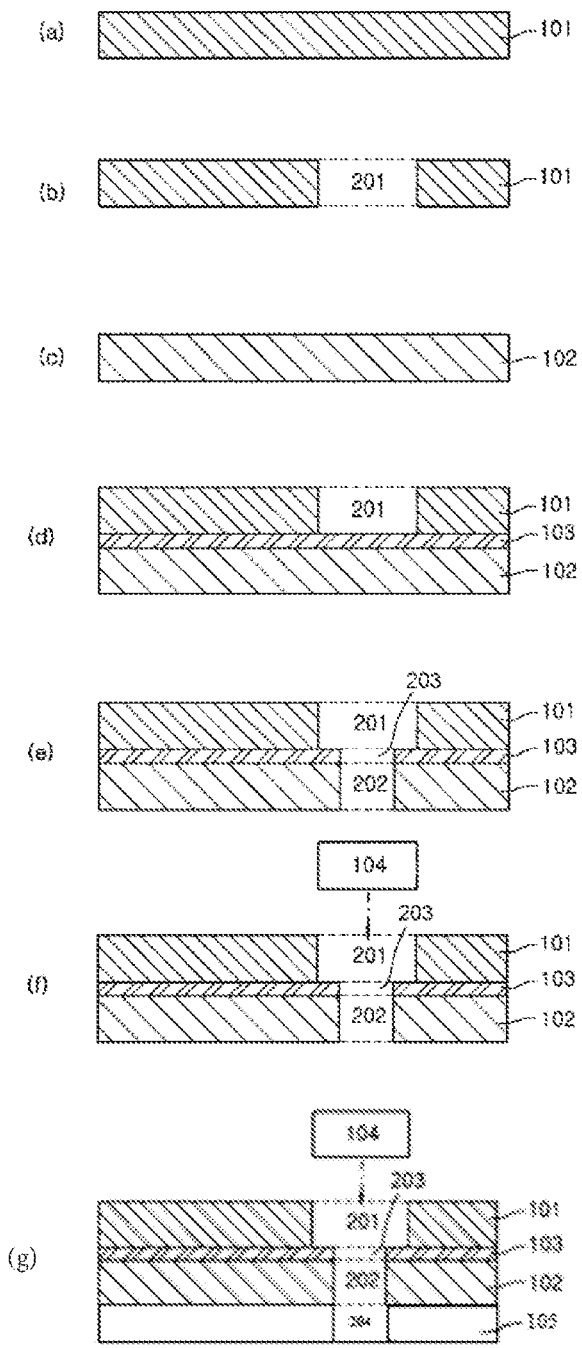

[Fig. 2]
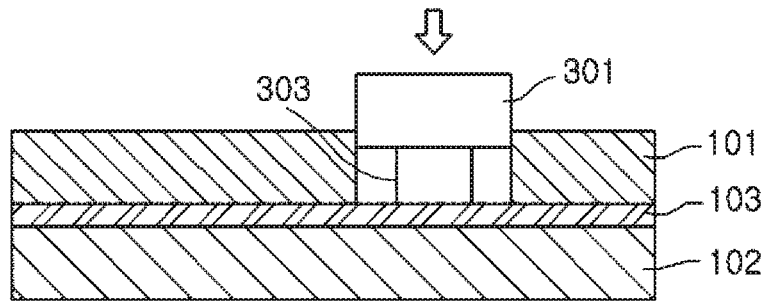
[Fig. 3]
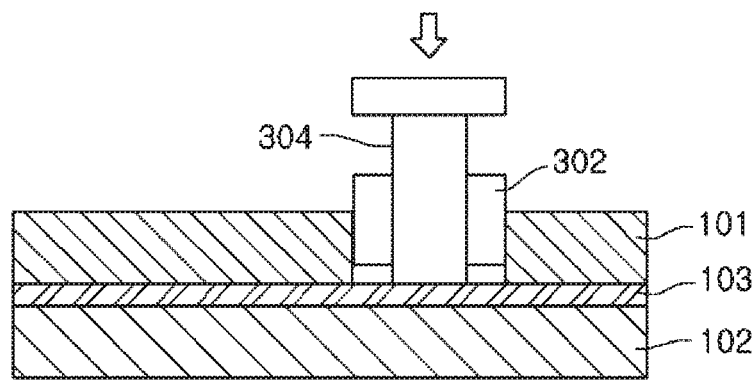
[Fig. 4]
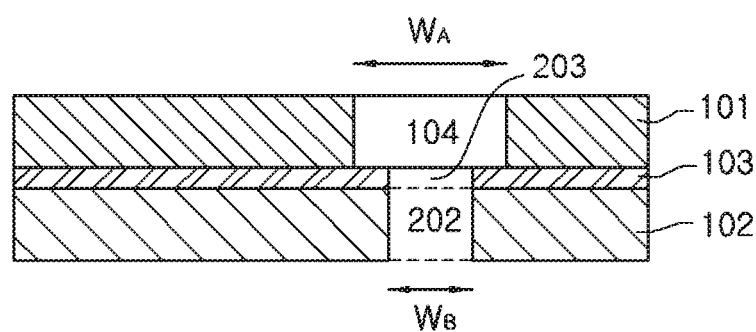

POLISHING PAD AND METHOD FOR PRODUCING SAME

This application is a national stage application of PCT/KR2018/000850 filed on Jan. 18, 2018, which claims priority of Korean patent application number 10-2017-0010401 filed on Jan. 23, 2017. The disclosure of each of the foregoing applications is incorporated herein by reference in its entirety.

TECHNICAL FIELD

The embodiments hereinafter relate to a polishing pad for use in a chemical mechanical planarization (CMP) process of semiconductors and a process for preparing the same.

BACKGROUND ART

The chemical mechanical planarization (CMP) process in a process for preparing semiconductors refers to a step in which a wafer is fixed to a head and in contact with the surface of a polishing pad mounted on a platen, and the wafer is then chemically treated by supplying a slurry while the platen and the head are relatively moved to thereby mechanically planarize the irregularities on the wafer surface.

It is also important to determine the termination point at which the CMP process is terminated by detecting a point at which the desired surface characteristics or thickness of the wafer is obtained in the CMP process. Thus, various methods for determining the termination point at which the planarization is terminated have been developed; for example, a technique of inserting a transparent window into a polishing pad and optically measuring it has been known. Specifically, a light beam is directed through the window to the surface of the wafer that is being planarized, and then the wafer surface characteristics can be analyzed at the detector once the reflected light beam is returned through the window.

In a conventional laminated polishing pad having a window is generally manufactured by forming a hole passing through each of the polishing layer and the support layer and then bonding the layers. However, such a conventional method has a disadvantage in that it is necessary to perform a troublesome alignment step in which a notch formed in the polishing layer and that formed in the support layer are aligned in their positions.

In addition, a method of forming a releasable protective member at a portion corresponding to the light transmitting region and removing the bottom end portion of the desired position has been developed; however, it involves the problem that the optical transmittance is lowered because the adhesive layer remains at the bottom end of the light transmitting region (see Korean Patent No. 1633766).

DISCLOSURE OF INVENTION

Technical Problem

In the conventional laminated polishing pad having a window, a hole is generally formed in the polishing layer and in the support layer, respectively, which are then bonded to each other. Thus, it is difficult to form a light transmitting region at a predetermined position when the polishing pad is manufactured. It also has the problem that the optical transmittance is lowered due to the presence of the adhesive layer.

Accordingly, the embodiments hereinafter aim to provide a process for manufacturing a polishing pad, which is capable of easily forming a light transmitting region at a predetermined position without forming a notch and preventing delamination. of the layers without lowering the optical transmittance, and a polishing pad manufactured thereby.

Solution to Problem

According to an embodiment, there is provided a process for manufacturing a polishing pad, which comprises:
(a) providing a polishing layer;
(b) forming a first penetrating hole passing through the polishing layer;
(c) providing a support layer opposite to the polishing layer;
(d) interposing an adhesive layer between the polishing layer having the first penetrating hole formed therein and the support layer, and bonding the polishing layer and the support layer to each other with the adhesive layer;
(e) forming a third penetrating hole passing through the adhesive layer in a predetermined region of the adhesive layer and a second penetrating hole passing through the support layer in a predetermined region of the support layer based on the first penetrating hole; and
(f) inserting a window into the first penetrating hole.

According to another embodiment, there is provided a polishing pad, which comprises:
a polishing layer having a first penetrating hole formed therein;
a support layer opposed to the polishing layer and having a second penetrating hole formed in the region in which the first penetrating hole is formed;
an adhesive layer interposed between the polishing layer and the support layer and having a third penetrating hole formed in the region in which the first penetrating hole is formed; and
a window inserted in the first penetrating hole and bonded to the adhesive layer,
wherein the first penetrating hole and the second penetrating hole are aligned with each other, while the polishing layer and the support layer have no notch formed therein to align the first penetrating hole and the second penetrating hole.

Advantageous Effects of Invention

The process for manufacturing a polishing pad according to the embodiment can readily form a light transmitting region at a predetermined position without forming a notch.

In addition, according to the above process, since an adhesive layer is not present at the bottom end of the window, a polishing pad having excellent optical transmittance can be provided.

Furthermore, since the above process uses a hot-melt adhesive, rather than a double-sided adhesive tape, to bond the polishing layer and the support layer, it is possible to manufacture a polishing pad wherein delamination of the layers is prevented.

BRIEF DESCRIPTION OF THE DRAWINGS

FIG. 1 schematically illustrates the process for manufacturing a polishing pad according to an embodiment.

FIG. 2 schematically illustrates a cutting method according to an embodiment.

FIG. 3 schematically illustrates a cutting method according to another embodiment.

FIG. 4 shows a polishing pad manufactured by the process for manufacturing a polishing pad according to an embodiment.

REFERENCE NUMERALS OF THE DRAWINGS

101: polishing layer 102: support layer
103: adhesive layer 104: window
105: adhesive tape
201: first penetrating hole 202: second penetrating hole
203: third penetrating hole
204: fourth penetrating hole 301: guide member
302: guide member 303: cutting member
304: cutting member
$W_A$: width of the first penetrating hole or width of the window in the cross-section of a polishing pad
$W_B$: width of the second penetrating hole or width of the third penetrating hole in the cross-section of a polishing pad

BEST MODE FOR CARRYING OUT THE INVENTION

Hereinafter, the process for manufacturing a polishing pad according to the above embodiment will be described in detail with reference to the accompanying drawings. In the drawings, the same reference numerals refer to the same elements, and the size and thickness of each element may be exaggerated for the convenience of explanation. Meanwhile, the embodiments described below are exemplary, and various modifications can be made from these embodiments.

FIG. 1 schematically illustrates the process for manufacturing a polishing pad according to an embodiment.

The polishing pad manufactured by the process for preparing a polishing pad comprises a polishing layer (101) having a first penetrating hole (201) formed therein, a support layer (102), an adhesive layer (103) interposed between the polishing layer (101) and the support layer (102), and a window (104) inserted in the first penetrating hole (201).

First, the polishing layer (101) is provided (see FIG. 1(a)).

The polishing layer (101) may be a foam or a non-foam, and preferably a foam having microbubbles.

The polishing layer (101) may comprise a polyurethane-based resin, a polyester-based resin, a polyamide-based resin, an acrylic-based resin, a polycarbonate-based resin, a halogen-based resin, a polystyrene-based resin, a polyolefin-based resin, an epoxy-based resin, a photosensitive resin, or any combination thereof, but is not limited to.

The polyurethane resin is preferable as a material for forming the polishing layer (101) because it is excellent in abrasion resistance and it is possible to readily obtain desired physical properties thereof by variously changing the composition of the raw materials.

The surface of the polishing layer (101) preferably has a concave-convex structure in order to maintain and replace a slurry. In addition, the concavo-convex structure generally has a regularity; however, it is possible to change the groove pitch, groove width, groove depth, and the like at specific positions for the purpose of maintaining and replacing a slurry.

The shape of the polishing layer (101) is not particularly limited, and the size of the polishing layer (101) may be appropriately adjusted according to the polishing apparatus to be used.

The thickness of the polishing layer (101) is not particularly limited and may be 0.8 to 5.0 mm, preferably 1.0 to 3.0 mm.

Then, the first penetrating hole (201) passing through the polishing layer (101) is to formed (see FIG. 1(b)).

The method of forming the first penetrating hole (201) passing through the polishing layer (101) includes a method of pressing or grinding with a cutting tool, a method of using a laser such as a carbonic acid laser, a method of injecting a raw material into a mold having a shape conforming to the first penetrating hole (201) and curing it, and the like, but is not limited thereto.

The plane shape of the first penetrating hole (201) is not particularly limited and may be circular, elliptical, square, rectangular, or polygonal.

Next, the support layer (102) opposite to the polishing layer (101) is provided (see FIG. 1(c)).

The support layer (102) may be a polyester nonwoven fabric type impregnated with a polyurethane resin, a suede type of a polyurethane resin, a foam type of a polyurethane resin, or any combination thereof, but is not limited thereto.

The thickness of the support layer (102) is not particularly limited and may be 0.1 to 3.0 mm, preferably 0.4 to 1.5 mm.

Then, the adhesive layer (103) is interposed between the polishing layer (101) having the first penetrating hole (201) formed therein and the support layer (102), and the polishing layer (101) and the support layer (102) are bonded to each other with the adhesive layer (103) (see FIG. 1(d)).

The adhesive layer (103) may comprise a polyurethane-based resin, a polyester-based resin, an ethylene-vinyl acetate-based resin, a polyamide-based resin, a polyolefin-based resin, or any combination thereof, but is not limited to. Preferably, the adhesive layer (103) may be a polyurethane-based resin, a polyester resin-based, or a combination thereof.

The adhesive layer (103) may comprise a first adhesive layer attached to one side of the polishing layer (101) and a second adhesive layer attached to one side of the support layer (102).

For example, the adhesive layer (103) may be composed of the first adhesive layer and the second adhesive layer.

The materials of the first adhesive layer and the second adhesive layer may be the same as those exemplified above as the material of the adhesive layer.

The thickness of the adhesive layer (103) may be 10 to 400 μm, preferably 20 to 250 μm.

Further, the thickness of the first adhesive layer may be 5 to 200 μm, preferably 10 to 125 μm.

Further, the thickness of the second adhesive layer may be 5 to 200 μm, preferably 10 to 125 μm.

If the thickness of the adhesive layer (103) is within the above range, the polishing layer and the support layer can be bonded by melting the adhesive layer at a low temperature, and it is advantageous in that the adhesive strength is strong.

The first adhesive layer and the second adhesive layer may be heated so that a part or the whole thereof is melted, and then the first adhesive layer and the second adhesive layer may be in contact to adhere to each other to thereby form the adhesive layer (103).

The melting temperature of the first adhesive layer and the second adhesive layer may be 80 to 170° C.

If the melting temperature of the first adhesive layer and the second adhesive layer is within the above range, the adhesiveness of the adhesive layer (103) is excellent, and it is possible to prevent the polishing layer (101) and the support layer (102) from being easily delaminated from each other and to prevent the polishing layer (101) or the support layer (102) from being deformed or deteriorated.

In the case where the polishing layer (101) and the support layer (102) are bonded to each other with the adhesive layer (103), the polishing layer (101) and the support layer (102) are not easily delaminated and the capability of preventing slurry penetration may be excellent even after a long time of polishing.

Next, a third penetrating hole (203) passing through the adhesive layer (103) is formed in a predetermined region of the adhesive layer (103) and a second penetrating hole (202) passing through the support layer (102) is formed in a predetermined region of the support layer (102) based on the first penetrating hole (201) (see FIG. 1(e)).

Preferably, the third penetrating hole (203) is formed in the region in which the first penetrating hole (201) is formed, and the planar area of the third penetrating hole (203) may be smaller than the planar area of the first penetrating hole (201).

In addition, the second penetrating hole (202) is formed in the region in which the first penetrating hole (201) is formed, and the planar area of the second penetrating hole (202) may be smaller than the planar area of the first penetrating hole (201).

The plane shape of the third penetrating hole (203) is not particularly limited and may be circular, elliptical, square, rectangular, or polygonal.

In addition, the plane shape of the second penetrating hole (202) is not particularly limited and may be circular, elliptical, square, rectangular, or polygonal.

If the planar area of the third penetrating hole (203) and the planar area of the second penetrating hole (202) are made to be smaller than the planar area of the first penetrating hole (201), it is possible to effectively fix a window in the first penetrating hole (201) since the adhesive layer (103) and the support layer (102) that can support the window are present at the bottom end of the first penetrating hole (201).

Preferably, the third penetrating hole (203) and the second penetrating hole (202) may be formed at the same time so that the third penetrating hole (203) and the second penetrating hole (202) correspond to each other.

The third penetrating hole (203) and the second penetrating hole (202) may be formed by cutting them using a guide member.

Specifically, the step of forming the third penetrating hole (203) and the second penetrating hole (202) based on the first penetrating hole (201) comprises inserting a guide member into the first penetrating hole (201); aligning the cutting member at a predetermined position by the guide member; and cutting a part of the adhesive layer and a part of the support layer by the cutting member.

The cutting member can be fixed to the guide member or guided by the guide member.

The guide member may be in contact with the inner side of the first penetrating hole (201) to guide the cutting member.

The cutting member can cut the adhesive layer (103) and the support layer (102) at the same time.

The method of forming the third penetrating hole (203) and the second penetrating hole (202) as described above is simple because it is capable of readily forming a light transmitting region at a predetermined position without forming a notch as compared with the conventional method in which a penetrating hole is formed in the polishing layer and in the support layer, respectively, and then the layers are bonded to each other. In addition, if the third penetrating hole (203) and the second penetrating hole (202) are formed at the same time based on first penetrating hole (201) such that they correspond to each other, the adhesive layer (103) is not present in the light transmitting region, whereby it is possible to manufacture a polishing pad having excellent optical detection accuracy.

Then, the window (104) is inserted into the first penetrating hole (201) (see FIG. 1(f)).

The window (104) may have the same size as that of the first penetrating hole (201).

The window (104) may be a foam or a non-foam, preferably a non-foam. If the window (104) is a non-foam, there are no microbubbles in the window (104), whereby it is possible to reduce the possibility of shiny penetration, resulting in improvements in the optical detection accuracy and prevention of damage to the light transmission region.

The window (104) may comprise a polyester-based resin, a polyamide-based resin, an acrylic-based resin, a polycarbonate-based resin, a halogen-based resin, a polystyrene-based resin, a polyolefin-based resin, an epoxy-based resin, a photosensitive resin, or any combination thereof, but is not limited thereto.

It is preferable that the window (104) has a wear rate that is the same as, or slightly higher than, the wear rate of the material used for the polishing layer (101). If the wear rate of the window (104) is lower than the wear rate of the polishing layer (101), the window portion only can be protruded after polishing is carried out for a certain period of time, whereby scratches may be generated on the wafer to be polished or the wafer may be broken in a worse case.

The light transmittance of the window (104) may be 20% or more at a wavelength of 400 to 700 nm, more preferably 30% or more at a wavelength of 670 to 680 nm.

The process for manufacturing a polishing pad may further comprise bonding the window (104) to the adhesive layer (103).

In the step of bonding the window (104) to the adhesive layer (103), a part or the whole of the adhesive layer (103) may be melted and adhered to the window (104).

In such event, the melting temperature of the adhesive layer (103) may be 80 to 170° C.

If the melting temperature of the adhesive layer (103) is within the above range, the bonding of the adhesive layer (103) and the window (104) is excellent, and it is possible to prevent the adhesive layer (103), the polishing layer (101), and the support layer (102) from being deformed or deteriorated. In addition, it is possible to prevent the slurry from penetrating between the adhesive layer (103) and the window (104) even after a long time of polishing.

In order to bond the window (104) to the adhesive layer (103), heat or vibration may be used, but the bonding method is not limited thereto. Specifically, a heat fusion method or an ultrasonic fusion method may be used to bond and fix the window (104) to the adhesive layer (103).

Meanwhile, the process for manufacturing a polishing pad according to another embodiment —shown in FIG. 1 (g) may further comprise providing an adhesive tape 105 to the support layer 102.

In such event, the adhesive tape 105 may be adhered to the opposite side of the support layer 102 on which the adhesive layer 103 is formed.

The adhesive tape 105 may be a double-sided adhesive tape.

The adhesive tape 105 is used for the purpose of mounting the polishing pad on a platen.

In addition, the process for manufacturing a polishing pad may further comprise forming a fourth penetrating hole 204 passing through the adhesive tape in a predetermined region of the adhesive tape 105 based on the first penetrating hole 201.

The fourth penetrating hole 204 is formed in the region in which the first penetrating hole 201 is formed, and the planar area of the fourth penetrating hole 204 may be smaller than the planar area of the first penetrating hole 201.

Preferably, the third penetrating hole, the second penetrating hole, and the fourth penetrating hole may be formed at the same time. Specifically, the third penetrating hole, the second penetrating hole, and the fourth penetrating hole may be formed at the same time so that the third penetrating hole, the second penetrating hole, and the fourth penetrating hole correspond to each other.

In such event, since neither the adhesive layer nor the adhesive tape is present the light transmitting region, a polishing pad having excellent optical detection accuracy can be obtained.

Referring to FIG. 2, the cutting method according to an embodiment will be described hereinafter.

Specifically, FIG. 2 schematically illustrates an embodiment by which the third penetrating hole passing through the adhesive layer (103) and the second penetrating hole passing through the support layer (102) are formed.

A guide member (301) to which a cutting member (303) is coupled may be used in order to form the third penetrating hole and the second penetrating hole.

The guide member (301) is inserted into the first penetrating hole passing through the polishing layer (101), the cutting member (303) is aligned at a predetermined position by the guide member (301), a pressure is vertically applied to the top end of the guide member (301) to cut a part of the adhesive layer (103) and a part of the support layer (102).

The guide member (301) may be in contact with the inner side of the first penetrating hole to guide the cutting member, and the cutting member can cut the adhesive layer (103) and the support layer (102) at the same time.

Meanwhile, referring to FIG. 3, the cutting method according to another embodiment will be described hereinafter.

Specifically, FIG. 3 schematically illustrates another embodiment by which the third penetrating hole passing through the adhesive layer (103) and the second penetrating hole passing through the support layer (102) are formed.

A cutting member (304) may be guided by a guide member (302) in order to form the third penetrating hole and the second penetrating hole.

The guide member (302) is inserted into the first penetrating hole passing through the polishing layer (101), the cutting member (304) is aligned at a predetermined position by the guide member (302), a pressure is vertically applied to the upper end of the guide member (302) to cut a part of the adhesive layer (103) and a part of the support layer (102).

The guide member (302) may be in contact with the inner side of the first penetrating hole to guide the cutting member, and the cutting member can cut the adhesive layer (103) and the support layer (102) at the same time.

Referring to FIG. 4, the polishing pad according to an embodiment will be described hereinafter.

The polishing pad comprises a polishing layer (101) having a first penetrating hole formed therein; a support layer (102) opposed to the polishing layer (101) and having a second penetrating hole (202) formed in the region in which the first penetrating hole is formed; an adhesive layer (103) interposed between the polishing layer (101) and the support layer (102) and having a third penetrating hole (203) formed in the region in which the first penetrating hole is formed; and a window (104) inserted in the first penetrating hole and bonded to the adhesive layer (103), wherein the first penetrating hole and the second penetrating hole (202) are aligned with each other, while the polishing layer (101) and the support layer (102) have no notch formed therein to align the first penetrating hole and the second penetrating hole (202).

Preferably, a part or the whole of the adhesive layer (103) is melted and adhered to the window (104).

The polishing pad may be a polishing pad manufactured by the process for manufacturing a polishing pad as described above.

FIG. 4 shows a cross-section of the polishing pad according to an embodiment. Specifically, FIG. 4 shows a cross-section of the region of the polishing pad where the window (104), the third penetrating hole (203), and the second penetrating hole (202) are all present.

In FIG. 4, $W_A$ represents the width of the first penetrating hole or the width of the window (104) in the cross-section of the polishing pad, and $W_B$ represents the width of the second penetrating hole (202) or the width of the third penetrating hole (203) in the cross-section of the polishing pad.

$W_A$ may be 10 to 100 mm, but is not limited thereto.

$W_B$ may be 5 to 95 mm, but is not limited thereto.

In the meantime, it is preferable that $W_B$ is smaller than $W_A$.

For example, $W_B$ may be 17 to 95% of $W_A$, but is not limited thereto.

If $W_B$ is 17 to 95% of $W_A$, it is possible to prevent that the support layer interferes with the transmission and reflection of a light beam, which causes an error, and it may be more advantageous to stably fix the window (104) to the polishing pad.

Since the polishing pad has neither a film nor an adhesive layer at the bottom end of the window (104), the polishing pad has excellent optical transmittance.

It is possible for the polishing pad as described above to detect whether the substrate has reached the desired surface flatness or the desired layer thickness or whether the underlying layer has been exposed, in order to determine whether to terminate the polishing in the CMP process.

There exist various techniques for in-situ detection of a termination point in the CMP process.

For example, an optical monitoring system for in-situ measurement of the uniformity of the layer on the substrate during polishing may be used.

The optical monitoring system may comprise a light source that directs light toward the substrate during polishing, a detector that measures light reflected from the substrate, and a computer that analyzes the signal from the detector and calculates whether a termination point has been detected.

The invention claimed is:

1. A process for manufacturing a polishing pad, which comprises:
   (a) providing a polishing layer;
   (b) forming a first penetrating hole passing through the polishing layer;
   (c) providing a support layer opposite to the polishing layer;
   (d) interposing an adhesive layer between the polishing layer having the first penetrating hole formed therein and the support layer, and bonding the polishing layer and the support layer to each other with the adhesive layer;

(e) forming a third penetrating hole passing through the adhesive layer in a predetermined region of the adhesive layer and a second penetrating hole passing through the support layer in a predetermined region of the support layer based on the first penetrating hole;

(f) inserting a window into the first penetrating hole; and (g) bonding the window to the adhesive layer, wherein the adhesive layer comprises a first adhesive layer attached to one side of the polishing layer and a second adhesive layer attached to one side of the support layer, wherein the window is a non-foam, wherein the window has a wear rate that is the same as, or higher than the wear rate of the material used for the polishing layer, wherein $W_b$ is 17 to 95% of $W_A$, wherein $W_A$ represents the width of the window in the cross-section of the polishing pad, and $W_b$ represents the width of the second penetrating hole, wherein, in the step of bonding the window to the adhesive layer, a part or the whole of the adhesive layer is melted and adhered to the window, and the window is bonded to the adhesive layer by heat or vibration, wherein the melting temperature of the first adhesive layer and the second adhesive layer is 80 to 170° C., and wherein the step (e) comprises inserting a guide member into the first penetrating hole; aligning a cutting member at a predetermined position by the guide member; and cutting a part of the adhesive layer and a part of the support layer by the cutting member, and the cutting member is fixed to the guide member or guided by the guide member.

2. The process for manufacturing a polishing pad of claim 1, wherein the third penetrating hole is formed in the region in which the first penetrating hole is formed, and the planar area of the third penetrating hole is smaller than the planar area of the first penetrating hole; and the second penetrating hole is formed in the region in which the first penetrating hole is formed, and the planar area of the second penetrating hole is smaller than the planar area of the first penetrating hole.

3. The process for manufacturing a polishing pad of claim 2, wherein the third penetrating hole and the second penetrating hole are formed at the same time so that the third penetrating hole and the second penetrating hole correspond to each other.

4. The process for manufacturing a polishing pad of claim 3, which further comprises adhering an adhesive tape to the support layer; and forming a fourth penetrating hole passing through the adhesive tape in a predetermined region of the adhesive tape based on the first penetrating hole, wherein the adhesive tape is adhered to the opposite side of the support layer on which the adhesive layer is formed, and the third penetrating hole, the second penetrating hole, and the fourth penetrating hole are formed at the same time.

5. The process for manufacturing a polishing pad of claim 1, wherein the guide member is in contact with the inner side of the first penetrating hole to guide the cutting member.

6. The process for manufacturing a polishing pad of claim 5, wherein the cutting member cuts the adhesive layer and the support layer at the same time.

* * * * *